US 7,741,847 B2

(12) United States Patent
Nakabayashi et al.

(10) Patent No.: US 7,741,847 B2
(45) Date of Patent: Jun. 22, 2010

(54) MAGNETIC RESONANCE APPARATUS WITH TEMPERATURE CONTROLLED MAGNET SHIM PIECES

(75) Inventors: Kazuto Nakabayashi, Nasushiobara (JP); Masatoshi Hanawa, Otawara (JP)

(73) Assignees: Kabushiki Kaisha Toshiba, Minato-Ku, Tokyo (JP); Toshiba Medical Systems Corporation, Otawara-Shi, Tochigi-Ken (JP)

( * ) Notice: Subject to any disclaimer, the term of this patent is extended or adjusted under 35 U.S.C. 154(b) by 0 days.

(21) Appl. No.: 11/907,198

(22) Filed: Oct. 10, 2007

(65) Prior Publication Data

US 2008/0088311 A1 Apr. 17, 2008

(30) Foreign Application Priority Data

Oct. 13, 2006 (JP) .............................. 2006-280515

(51) Int. Cl.
*G01V 3/00* (2006.01)

(52) U.S. Cl. ....................... 324/320; 324/318

(58) Field of Classification Search .......... 324/300–322
See application file for complete search history.

(56) References Cited

U.S. PATENT DOCUMENTS

| 6,777,939 | B2 * | 8/2004 | Bechtold et al. | 324/322 |
| 6,788,060 | B1 * | 9/2004 | Feenan et al. | 324/320 |
| 6,825,663 | B2 * | 11/2004 | Bechtold et al. | 324/318 |
| 6,825,667 | B1 * | 11/2004 | Tsuda | 324/320 |
| 6,867,592 | B2 * | 3/2005 | Gebhardt et al. | 324/318 |
| 7,224,167 | B2 * | 5/2007 | Jarvis et al. | 324/318 |
| 7,271,591 | B1 * | 9/2007 | Legall et al. | 324/320 |

FOREIGN PATENT DOCUMENTS

| JP | 2-206436 | 8/1990 |
| JP | 8-215168 | 8/1996 |
| JP | 2004-351207 | 12/2004 |
| JP | 2005288025 A * | 10/2005 |

* cited by examiner

*Primary Examiner*—Brij B Shrivastav
*Assistant Examiner*—Dixomara Vargas
(74) *Attorney, Agent, or Firm*—Nixon & Vanderhye PC

(57) ABSTRACT

A magnetic resonance apparatus in which magnetic metal pieces are accommodated in an accommodation section so as to correct uniformity in a main magnetic field, includes an acquisition unit which acquires temperature information related to at least one of a temperature of the magnetic metal pieces accommodated in the accommodation section, a temperature of the accommodation section, and a temperature of a position in the vicinity of the accommodation section, and a temperature adjustment unit which adjusts the temperature of the magnetic metal pieces to a target temperature by preheating the magnetic metal pieces on the basis of the temperature information acquired by the acquisition unit.

19 Claims, 3 Drawing Sheets

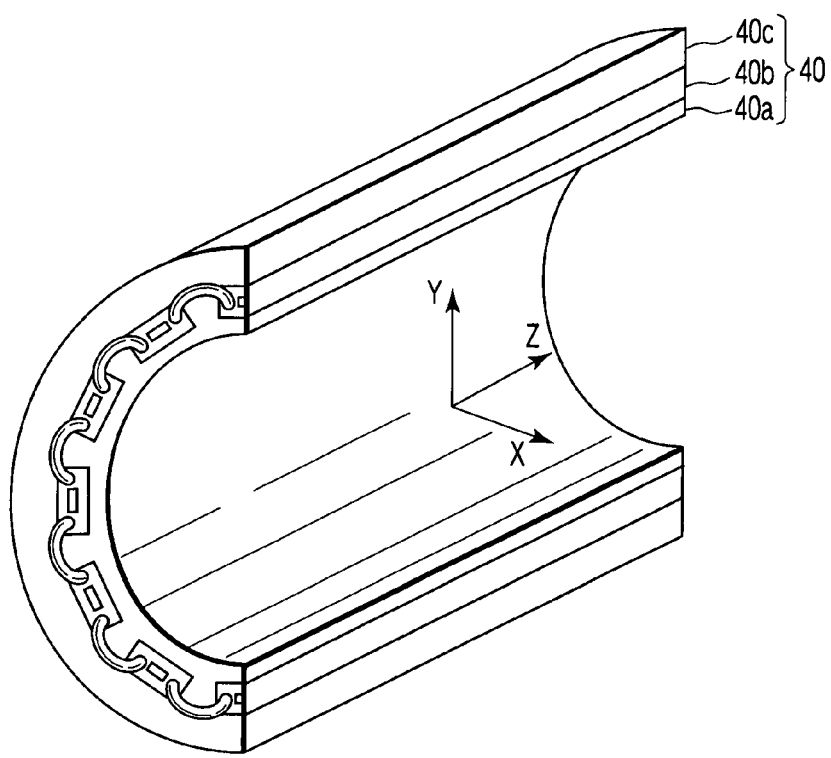
F I G. 4
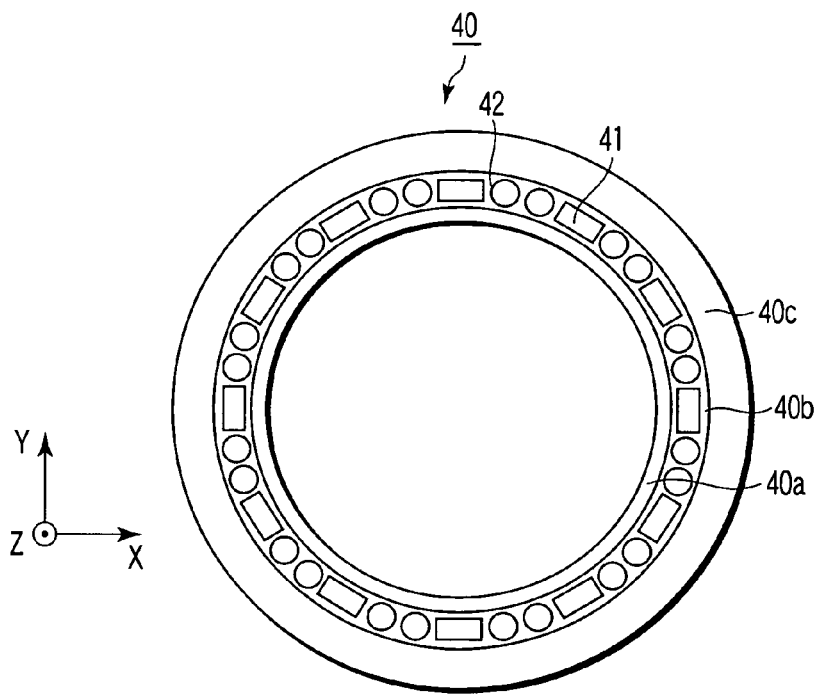
F I G. 5

MAGNETIC RESONANCE APPARATUS WITH TEMPERATURE CONTROLLED MAGNET SHIM PIECES

CROSS-REFERENCE TO RELATED APPLICATIONS

This application is based upon and claims the benefit of priority from prior Japanese Patent Application No. 2006-280515, filed Oct. 13, 2006, the entire contents of which are incorporated herein by reference.

BACKGROUND OF THE INVENTION

1. Field of the Invention

The present invention relates to a magnetic resonance apparatus in which a magnetic metal part is accommodated in an accommodation section for correction of uniformity in a main magnetic field.

2. Description of the Related Art

A magnetic resonance apparatus is provided with a magnet (a permanent magnet or an electromagnet) for generating a main magnetic field and a gradient magnetic field system (a gradient coil) for generating a gradient magnetic field. The main magnetic field is a static magnetic field and should desirably have high uniformity. In order to maintain the uniformity of the main magnetic field, shimming is performed. Shimming is roughly classified into passive shimming and active shimming. In the passive shimming, a magnetic metal piece (iron piece or the like) called a shim is arranged in the vicinity of the magnet, thereby adjusting magnetic field distribution of the main magnetic field. More specifically, arrangement of a plurality of magnetic metal pieces is contrived, whereby uniformity of the main magnetic field is maintained. In the active shimming, by adjusting a current to be caused to flow through a coil (shim coil), a correction magnetic field for uniformizing the main magnetic field is generated.

Then, in the passive shimming, it is known that non-uniformity of the main magnetic field is caused by variation of the temperature of the magnetic metal piece. It is also known that an offset is caused in the main magnetic field by the variation of the temperature of the magnetic metal piece. As a cause of the temperature variation, heat generation from a gradient coil and heat generation caused in a magnetic metal by an eddy current induced by generation a gradient magnetic field are mainly considered. When the temperature of the magnetic metal is changed by such heat generation, the magnetic susceptibility of the magnetic metal is changed and, as a result of this, the intensity of the main magnetic field is changed locally or entirely.

A technique is known in which a correction magnetic field for correcting non-uniformity or the like of the main magnetic field is included in a gradient magnetic field (see, for example, Jpn. Pat. Appln. KOKAI Publication No. 2-206436). In this technique, a temperature of a magnet is detected, and a correction amount is determined in accordance with the temperature. Further, an offset of a current value corresponding to the correction amount is added to a current for generating a gradient magnetic field which is originally required, and the resultant current is supplied to a gradient coil.

In the above-mentioned prior art technique, the main magnetic field is corrected by the gradient magnetic field, and hence the correction amount and the correction resolution have their limits, and there has been no guarantee that the uniformity and intensity of the main magnetic field could have been kept constant.

BRIEF SUMMARY OF THE INVENTION

Under these circumstances, it has been required to make the passive shimming effectively function and maintain the main magnetic field stable.

According to a first aspect of the present invention, there is provided a magnetic resonance apparatus in which magnetic metal pieces are accommodated in an accommodation section so as to correct uniformity in a main magnetic field, comprising: an acquisition unit which acquires temperature information related to at least one of a temperature of the magnetic metal pieces accommodated in the accommodation section, a temperature of the accommodation section, and a temperature of a position in the vicinity of the accommodation section; and a temperature adjustment unit which adjusts the temperature of the magnetic metal pieces to a target temperature by preheating the magnetic metal pieces on the basis of the temperature information acquired by the acquisition unit.

According to a first aspect of the present invention, there is provided a magnetic resonance apparatus in which magnetic metal pieces are accommodated in an accommodation section so as to correct uniformity in a main magnetic field, comprising: acquisition unit which acquires temperature information related to at least one of a temperature of the magnetic metal pieces accommodated in the accommodation section, a temperature of the accommodation section, and a temperature of a position in the vicinity of the accommodation section; and temperature adjustment unit which adjusts the temperature of the magnetic metal pieces to a target temperature higher than the normal temperature on the basis of the temperature information acquired by the acquisition unit.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate embodiments of the invention, and together with the general description given above and the detailed description of the embodiments given below, serve to explain the principles of the invention.

FIG. 4 is a perspective view showing the configuration of a gradient coil unit provided with a cooling mechanism that can be utilized as cooling unit for a magnetic metal piece.

FIG. 5 is a cross-sectional view of the gradient coil unit provided with the cooling mechanism that can be utilized as cooling unit for a magnetic metal piece in the XY-plane.

DETAILED DESCRIPTION OF THE INVENTION

An embodiment of the present invention will be described below with reference to the accompanying drawings.

Figure 1:
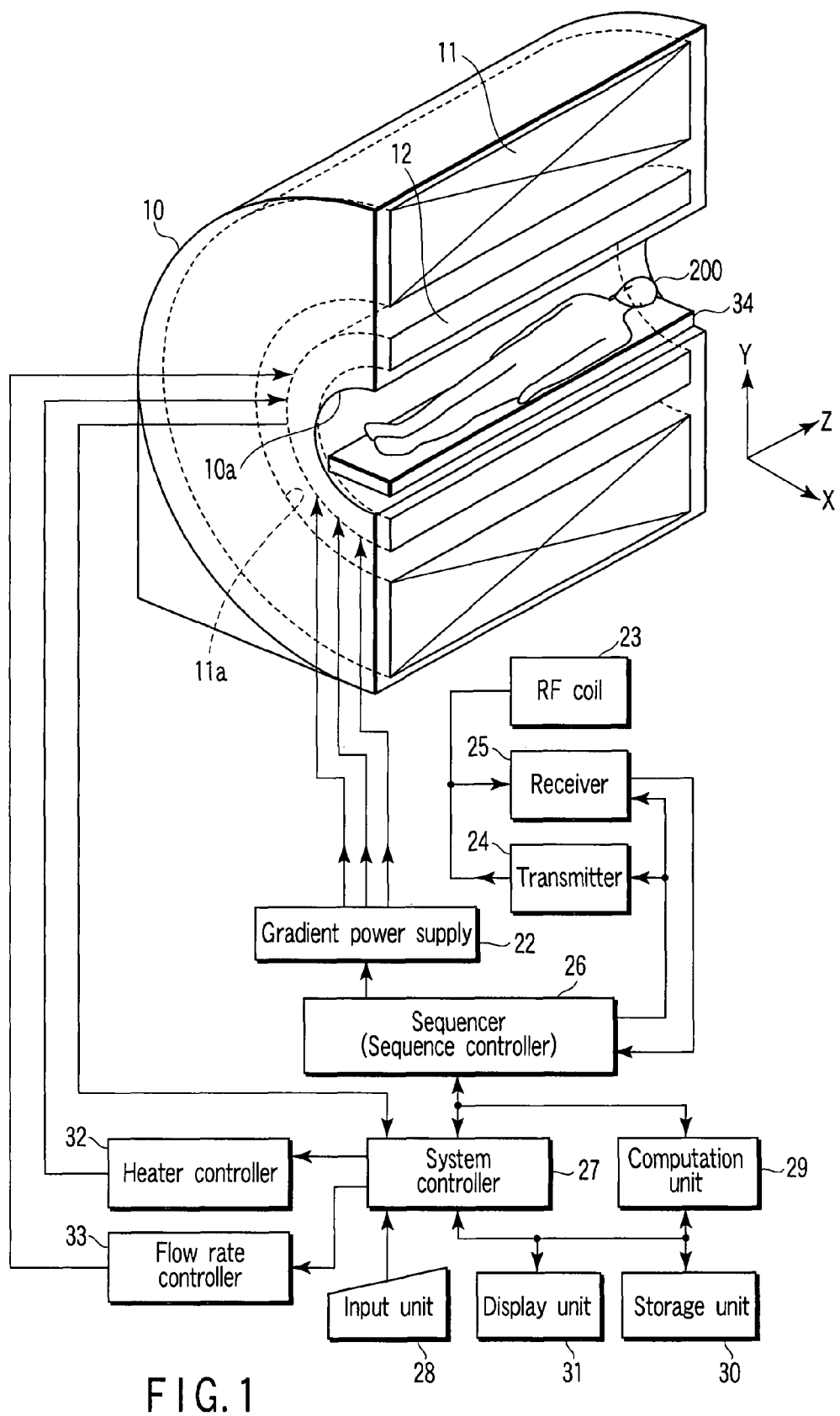
FIG. 1 is a schematic view of a part of an MRI apparatus according to an embodiment of the present invention.

FIG. 1 is a schematic view of a part of a magnetic resonance imaging (MRI) apparatus 100 according to the embodiment of the present invention.

The MRI apparatus 100 of this embodiment comprises a gantry 10, a magnet 11, a gradient coil unit 12, a gradient power supply 22, a radio frequency coil (RF coil) 23, a transmitter 24, a receiver 25, a sequencer 26, a system controller 27, an input unit 28, an computation unit 29, a storage unit 30, a display unit 31, a heater controller 32, and a flow rate controller 33. In addition, the MRI apparatus 100 includes a bed (not shown) which is disposed adjacent to the gantry 10. The gantry 10 is typically formed in such a manner that a substantially cylindrical imaging space 10a is formed in the center thereof so as to allow the space 10a to penetrate the gantry 10. The axial direction of the imaging space 10a is defined as the Z direction, and the remaining two directions which are perpendicular to the Z direction and are perpendicular to each other are defined as the X direction (lateral direction) and the Y direction (vertical direction). In FIG. 1, only half the gantry 10 cut away by the YZ-plane is shown.

The magnet 11 and the gradient coil unit 12 are accommodated in the gantry 10. The magnet 11 generates the main magnetic field (static magnetic field) Bo in the imaging space 10a. A superconducting magnet is typically used as the magnet 11. The entire shape of the magnet 11 is in a substantially cylindrical shape. A magnet bore (hereinafter referred to as a bore) 11a is formed inside the magnet 11. The central axis of the bore 11a coincides with the central axis of the imaging space 10a. The gradient coil unit 12 is disposed in the bore 11a. The gradient magnetic coil 12 includes three sets of coils for receiving a supply of driving currents corresponding to the X-, Y-, and Z-axes, respectively, from the gradient power supply 22 and generating the gradient magnetic fields respectively corresponding to the X-, Y-, and Z-axes.

At the time of imaging, the RF coil 23 is placed inside the imaging space 10a. The transmitter 24 and the receiver 25 are connected to the RF coil 23. The transmitter 24 supplies a pulse current oscillating at the Larmor frequency to the RF coil 23 under the control of the sequencer 26. The receiver 25 receives a magnetic resonance (MR) signal through the RF coil 23 and subjects the signal to various signal processing operations, thereby generating corresponding digital signals. A top plate 34 of the bed is arranged so that it can be moved toward and away from the imaging space 10a in the gantry 10, and an inspection object 200 is placed on the top surface thereof.

The sequencer 26 operates under the control of the system controller 27 that controls the entire MRI apparatus 100. The input unit 28 is connected to the system controller 27. The operator can select a desirable pulse sequence from a plurality of pulse sequences using a method such as a spin echo (SE) method or an echo planar imaging (EPI) method through the input unit 28. The system controller 27 sets a selected pulse sequence to the sequencer 26. The sequencer 26 controls the application timing and intensity of the gradient magnetic field in each of the X-, Y-, and Z-axes directions and the application timing, amplitude, and duration time of a high-frequency magnetic field, in accordance with the set pulse sequence.

The computation unit 29 receives an MR signal (digital data) generated by the receiver 25 and performs Fourier transform for arranging actually measured data in the two-dimensional Fourier space formed by a memory incorporated therein, and reconstructing the image, thereby generating image data or spectrum data. The storage unit 30 stores the computed image data. The display unit 31 displays the image.

The heater controller 32 controls an exothermic amount of heat generated by heaters (to be described later) incorporated in the gradient coil unit 12. The flow rate controller 33 controls the flow rate of a cooling liquid flowing through cooling pipes (to be described later) incorporated in the gradient coil unit 12. Incidentally, the cooling liquid is cooled by a cooling unit (not shown). The system controller 21 is provided with a function of controlling the heater controller 32 and the flow rate controller 33 so as to maintain the temperature of the magnetic metal incorporated in the gradient coil unit 12 at a target temperature on the basis of a temperature value measured by a sensor (to be described later) incorporated in the gradient coil unit 12.

Figure 2:
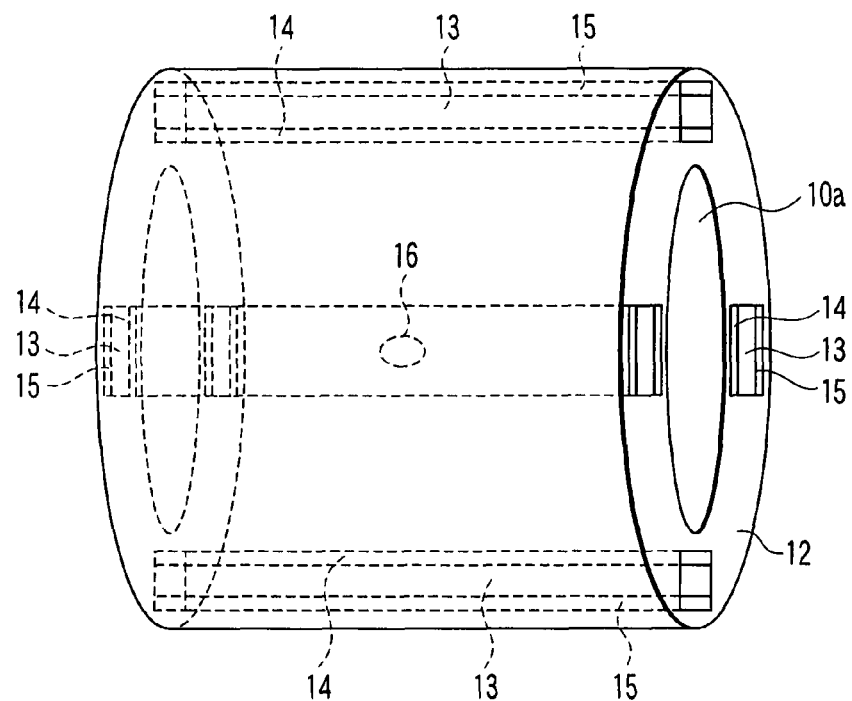
FIG. 2 is a perspective view showing the configuration of a gradient coil unit shown in FIG. 1.

FIG. 2 is a perspective view showing the outline configuration of the gradient coil unit 12.

As shown in FIG. 2, the gradient coil unit 12 is provided with a plurality of pockets 13, and includes a plurality of cooling pipes 14, a plurality of heaters 15, and a sensor 16.

Each of the pockets 13 has a through-hole shape formed along the axis of the gradient coil unit 12, and the magnetic metal pieces are arranged therein as needed. Incidentally, in FIG. 2, four pockets 13 are shown. The number of pockets 13 may be arbitrary. Although the number of pockets 13 is physically limited, the larger number of the pockets is desirable. This is because the degree of freedom of arrangement of the magnetic metal pieces is enhanced, and accuracy of correction of magnetic field uniformity can be improved. The desirable number of the pockets 13 is, for example, 12 or 24. Each of the cooling pipes 14 is arranged in each of the pockets 13 at a position adjacent to the inner circumferential side of the gradient coil unit 12 in parallel with each pocket 13. Each of the cooling pipes 14 serves as a flow path of the cooling liquid for cooling the magnetic metal pieces arranged in the pockets 13. A flow rate of the cooling liquid flowing through the cooling pipe 14 is controlled by the flow rate controller 33. Each of the heaters 15 is arranged in each of the pockets 13 at a position adjacent to the outer circumferential side of the gradient coil unit 12 in parallel with each pocket 13. Each of the heaters 15 heats the magnetic metal pieces arranged in each of the pocket 13. The heating temperature of the heater 15 is controlled by the heater controller 32. The sensor 16 is arranged in the vicinity of any pocket 13. The sensor 16 measures the temperature of the magnetic metal piece arranged in the pocket 13. The sensor 16 sends a signal indicative of the measured temperature value to the system controller 27. As the sensor 16, a semiconductor sensor or a thermocouple can be used.

Figure 3:
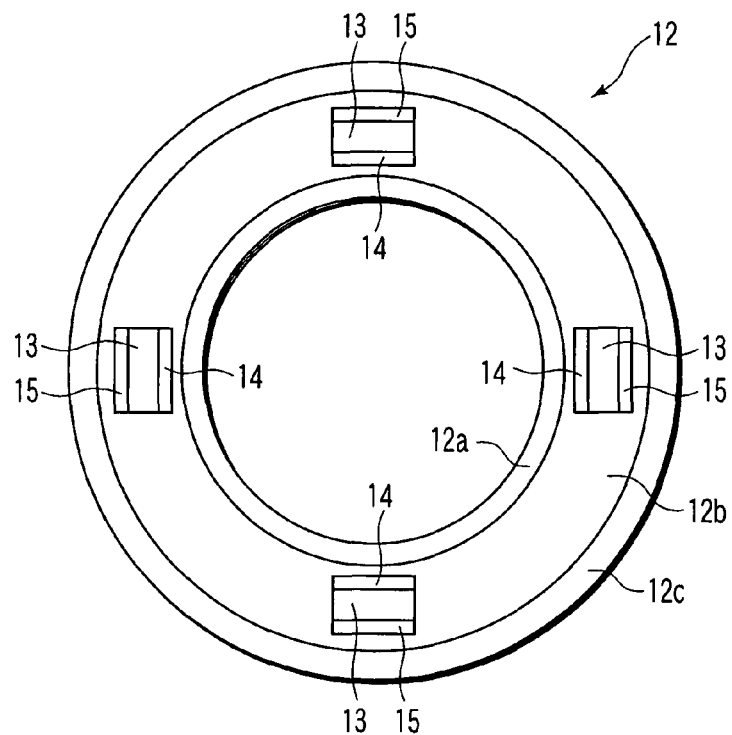
FIG. 3 is a cross-sectional view of the gradient coil unit shown in FIG. 1 in the XY-plane.

FIG. 3 is a cross-sectional view of the gradient coil unit 12 in the XY-plane.

As shown in FIG. 3, the gradient coil unit 12 is segmented into, from the inner circumferential side, a main coil layer 12a, shim layer 12b, and a shield coil layer 12c. Further, the pockets 13, cooling pipes 14, and heaters 15 are all provided in the shim layer 12b. The shim layer 12b is formed by molding a resin into a cylindrical shape together with the pockets 13, cooling pipes 14, and heaters 15. The main coil layer 12a is formed by molding a resin into a cylindrical shape together with three types of main coils (X-main coil, Y-main coil, and Z-main coil) for generating gradient magnetic fields each of which changes in the magnetic field intensity along corresponding one of the X-, Y-, and Z-axes by being supplied with currents from the gradient power supply 22. The shield coil layer 12c is formed by molding a resin into a cylindrical shape together with three types of shield coils (X-shield coil, Y-shield coil, and Z-shield coil) for generating magnetic fields for shielding a leakage magnetic field from the main coil layer 12a. That is, the gradient coil unit 12 is so-called an actively shielded gradient coil (ASGC).

Incidentally, in FIG. 3, only cross-sectional contours of the main coil layer 12a and the shield coil layer 12c are shown, and their detailed internal structures are omitted from the drawing.

Operations of the MRI apparatus 100 having the configuration described above will be described below.

At the time of imaging, the magnet 11 generates the main magnetic field in the imaging space 10a. The main magnetic field is normally required to exhibit field intensity of about several kilogauss to several tens of kilogauss (several tesla). The main magnetic field is required to have spatial uniformity in addition to the intensity. The spatial region which is required to have a uniform magnetic field is generally a spherical region having a diameter of about 50 cm. Where the intensity of the main magnetic field is 1.5 tesla, the spatial uniformity is required to be equal to or less than several tens of ppm at any position of the spatial region.

The magnet 11 is manufactured so that it can generate a magnetic field fulfilling the above conditions. However, the magnetic field generated by the magnet 11 is affected by magnetic materials existing in the peripheral regions so as to be distorted. Thus, for example, magnetic metal pieces are appropriately arranged in the pockets 13 as a part of installation work or maintenance work of the MRI apparatus 100 so that the non-uniformity of the main magnetic field can be corrected. That is, by arranging magnetic metal pieces in the pockets 13, the magnetic field distribution of the main magnetic field is changed by the influence of the magnetic metal pieces. Accordingly, by appropriately arranging magnetic metal pieces in such a manner that the change in the magnetic field distribution acts to correct the non-uniformity of the main magnetic field, the non-uniformity of the main magnetic field can be corrected.

However, the magnetic susceptibility of a magnetic metal piece is changed according to the temperature. When the susceptibility of the magnetic metal pieces arranged in the pockets 13 is changed, the influential condition of the magnetic metal pieces is changed with respect to the main magnetic field, and the non-uniformity of the main magnetic field is lowered. Thus, in order to suppress the lowering of the non-uniformity of the main magnetic field, the system controller 27 performs temperature control described below.

(Basic Operation)

When heat generated from the gradient coil 12 is transferred to the magnetic metal pieces in the pockets 13 and the temperature of the magnetic metal pieces becomes higher than a predetermined temperature or when the temperature of the magnetic metal pieces becomes lower than the predetermined temperature in the standby state, a value of the temperature of the magnetic metal pieces measured by the sensor 16 is transmitted to the system controller 27. When it is necessary to raise the temperature of the magnetic metal pieces, the system controller 27 issues an instruction to operate the heaters 15 and raise the temperature of the magnetic metal pieces to the predetermined temperature to the heater controller 32. On the contrary, when it is necessary lower the temperature of the magnetic metal pieces, the system controller 27 issues an instruction to increase the flow rate of the cooling liquid in the cooling pipes 14 to lower the temperature of the magnetic metal pieces to the predetermined temperature to the flow rate controller 33. The heater controller 32 or the flow rate controller 33 performs control so as to maintain the temperature of the magnetic metal pieces at the fixed temperature on the basis of the instruction from the system controller 27. As a result of this, the temperature of the magnetic metal pieces can be maintained substantially constant at all times, and hence variation in the magnetic susceptibility of the magnetic metal pieces caused by the variation in the temperature is reduced. Accordingly, the uniformity of the main magnetic field can be maintained.

The temperature control will be described below more specifically.

(At the Time of Arrangement Work of the Magnetic Metal Pieces)

When the work for arranging the magnetic metal pieces in the pockets 13 is performed, the system controller 27 recognizes the fact on the basis of, for example, an instruction or the like issued by an operator. Further, in this case, the system controller 27 controls the heater controller 32 and the flow rate controller 33 in such a manner that the temperature of the magnetic metal pieces measured by the sensor 16 becomes the predetermined target temperature. Here, the target temperature is set higher than the normal temperature. Furthermore, the target temperature is set lower than a temperature at which the resin or the like located around the magnetic metal pieces is degenerated. The range of the target temperature that satisfies such conditions is normally about 40 to 80° C.

At the time of the arrangement work of the magnetic metal pieces, normally, large heat generation is not caused in the gantry 10. For this reason, the temperature of the magnetic metal pieces arranged in the pockets 13 is about the normal temperature in many cases. That is, the temperature of the magnetic metal pieces is lower than the target temperature in many cases. Thus, in such a state, the system controller 27 controls the exothermic amount of the heaters 15 through the heater controller 32 in such a manner that the temperature of the magnetic metal pieces arranged in the pockets 13 is raised to the target temperature. If the temperature of the magnetic metal pieces is higher than the target temperature for some reason or if the temperature of the magnetic metal pieces becomes higher than the target temperature as a result of heating by the heaters 15, the system controller 27 controls the flow rate of the cooling liquid in the cooling pipes 14 through the flow rate controller 33 such that the temperature of the magnetic metal pieces arranged in the pockets 13 is lowered to the target temperature.

In this manner, the work for arranging the magnetic metal pieces in the pockets 13 is performed in the state where the temperature of the magnetic metal pieces becomes the target temperature. That is, the magnetic metal pieces are arranged in such a manner that the uniformity of the main magnetic field becomes high when the temperature of the magnetic metal pieces is the target temperature.

(At the Time of Imaging)

At the time of imaging, the current supply is switched to the main coils and the shield coils of the gradient coil unit 12 at a high speed. As a result of this, the main coil and the shield coil generate heat, and the magnetic metal pieces are heated by the generated heat. The magnetic metal pieces are also heated by the eddy current produced therein by the magnetic field. Hence, the system controller 27 increases the cooling power of the cooling liquid in accordance with the temperature rise of the magnetic metal pieces on the basis of the measurement result of the sensor 16, and controls the flow rate of the cooling liquid in the cooling pipes 14 so that the temperature of the magnetic metal pieces can be maintained at the target temperature through the flow rate controller 33.

Incidentally, when a standby state continues for a long period, the temperature of the magnetic metal pieces is about the normal temperature in some cases. In such a case, the system controller 27 controls the exothermic amount of the heaters 15 through the heater controller 32 so as to raise the temperature of the magnetic metal pieces to the target temperature. When the magnetic metal pieces are heated as described above, imaging may be started before the temperature of the magnetic metal pieces reaches the target temperature or may be started after waiting for the temperature of the magnetic metal pieces to reach the target temperature. In the former case, the imaging time can be shortened. In the latter case, imaging of a high image quality which is less affected by the variation in the main magnetic field can be performed.

When the imaging start time is determined in advance, the system controller 27 may control the heaters 15 through the heater controller 32 so as to raise the temperature of the magnetic metal pieces up to the target temperature before the imaging start time. By performing such a procedure, imaging of a high image quality which is less affected by the variation in the main magnetic field can performed, and the imaging time can be shortened. Needless to say, even in the standby state, the flow rate of the cooling liquid and the exothermic amount of the heaters 15 may be controlled by the system controller 27 so as to maintain the temperature of the magnetic metal pieces at the target temperature.

As described above, according to the MRI apparatus 100, the temperature of the magnetic metal pieces is stably maintained at substantially the target temperature at the imaging time, and hence variation in the uniformity of the main magnetic field caused by variation in the temperature of the magnetic metal pieces hardly occurs during imaging. As a result of this, it becomes possible to perform imaging in the stable main magnetic field, and obtain an image of a high image quality.

Further, in the MRI apparatus 100, even when the work for arranging the magnetic metal pieces is performed, the temperature of the magnetic metal pieces arranged in the pockets 13 is stably maintained at the target temperature. Therefore, when the arrangement of the magnetic metal pieces is appropriately performed at the time of the work, the state where the uniformity in the main magnetic field is high can be maintained at the time of imaging. As a result of this, it becomes possible to obtain a high quality image in which spatial unevenness in the image quality is small.

By the way, cooling of the gradient coil unit or the like has also been performed in the prior art. In such cooling in the prior art, it has been regarded as being desirable to lower the temperature of the object to be cooled as low as possible, and hence it has been regarded as being necessary to prepare a large cooling power. However, in the MRI apparatus 100, the target temperature is set as a temperature higher than the normal temperature, and the temperature of the magnetic metal is maintained at a somewhat high temperature. For this reason, the MRI apparatus 100 has only to be provided with a cooling power smaller than that required on the basis of conventional common sense. However, in the MRI apparatus 100, the target temperature is set lower than a temperature at which the resin or the like located around the magnetic metal pieces is degenerated, and hence members located around the magnetic metal pieces are never degenerated by maintaining the temperature of the magnetic metal pieces at a high temperature.

This embodiment can be variously modified and implemented as described below.

(1) The sensor 16 may be arranged at any position as long as it can measure a temperature related to the temperature of the magnetic metal piece. Needless to say, the sensor 16 may be arranged at any position in the vicinity of the magnetic metal pieces. However, the sensor 16 may be arranged at any position, as long as it is a position, for example, in a position at which a correlation between the temperature at the position and the variation in the temperature of the magnetic metal pieces can be observed (for example, a position at which 1.5 times the temperature variation appears when the temperature variation of the magnetic metal pieces becomes twice). In this case, by giving a correlation coefficient between the sensor 16 and the temperature of the magnetic metal to the system controller 27 in advance, the system controller can determine the temperature of the magnetic metal on the basis of the correlation coefficient and the value of the temperature measured by the sensor 16.

(2) In the embodiment described above, the MRI apparatus 100 includes the cooling pipes 14 serving as cooling units and the heater 15 serving as heating units. However, a cooling unit and a heating unit may be provided in the MRI apparatus 100. In this case, a cooling pipe serving as a cooling unit and a heater serving as a heating unit may be arranged in a spiral form along the central axis of the cylindrical shape of the gradient coil unit 12, thereby cooling or heating all the magnetic metal pieces. In this case, the cooling pipe and the heater may be arranged along one of the inner circumferential surface and the outer circumferential surface of the gradient coil unit 12, or may be arranged between the inner circumferential surface of the magnet 11 and the outer circumferential surface of the gradient coil unit 12. That is, any type of configuration may be employed as long as the magnetic metal pieces can be cooled or heated. Incidentally, the cooling medium may be a gas, such as the air.

(3) A configuration in which the position of the cooling pipe 14 and the position of the heater 15 are replaced with each other in the above embodiment may be employed. Further, a plurality of sensors 16 may be provided. For example, one sensor 16 is provided in each pocket 13, and temperature control may be performed separately for each of the magnetic metal pieces.

(4) As for the cooling unit, a cooling mechanism provided, in the prior art, in the gradient coil unit 12 for cooling the gradient coil unit 12 itself may be diverted to the cooling unit.

FIGS. 4 and 5 are views showing the configuration of a gradient coil unit 40 provided with a cooling mechanism that can be utilized as the cooling unit. FIG. 4 is a perspective view, and FIG. 5 is a cross-sectional view in the XY-plane. Incidentally, in FIG. 4, only half the gradient coil unit 40 cut away by the YZ-plane is shown. The gradient coil unit 40 includes a main coil layer 40*a*, a shim layer 40*b*, and a shield coil layer 40*c*. The main coil layer 40*a* and the shield coil layer 40*c* are equivalent to the main coil layer 12*a* and the shield coil layer 12*c* in the gradient coil unit 12, respectively. In the shim layer 40*b*, a plurality of pockets 41 each of which is equivalent to the pocket 13 are provided in the shim layer 40*b*. Furthermore, a plurality of cooling tubes 42 are arranged on a circle formed around the Z-axis. Each of the cooling tubes 42 is arranged in parallel with the Z-axis. The cooling tubes 42 arranged in such as manner that a pocket 41 is interposed between two pairs of cooling tubes 42. The cooling tube 42 has substantially a rectangular column-shape or a substantially cylindrical shape, and the inside thereof is a flow path through which cooling water flows. The plural tubes 42 are connected to each other at both ends of the gradient coil unit 40 as shown in FIG. 4 in such a manner that flow paths formed by the tubes 42 are connected to each other in series.

(5) As the heating unit, the main coil or the shield coil of the gradient coil unit 12 may be used. That is, when imaging is not performed, the current supply is switched to the main coil or the shield coil of the gradient coil unit 12 so as to cause the main coil or the shield coil to generate heat, thereby making it possible to heat the magnetic metal pieces. Incidentally, in the known imaging methods of the MRI, there are a method in which non-uniformity in the main magnetic field is a less serious problem, and a method in which non-uniformity in the main magnetic field is a serious problem. Thus, when the temperature of the magnetic metal is low, the former imaging method is used, and as a result of this, the temperature of the magnetic metal is raised up to the target temperature, thereafter the latter imaging method is used, whereby even switching of the current supply to the main coil or the shield coil to be performed when imaging is not performed can be omitted.

(6) The temperature control of the magnetic metal as in the above embodiment may be performed only at the time of imaging using the latter imaging method of the two imaging methods.

(7) It is desirable that the target temperature be a temperature at which the uniformity of the main magnetic field is the highest. However, even when the target temperature is out of such a temperature, by preventing the uniformity of the main magnetic field from varying during the imaging, the image quality can be made better than when the uniformity of the main magnetic field varies. Hence, the target temperature may be made variable automatically or manually. When the target temperature is automatically varied, it can be considered that the target temperature is set rather low when the temperature of the magnetic metal is low, for example, immediately after the start-up of the MRI apparatus 100, and that the target temperature is set rather high after the temperature of the magnetic metal is sufficiently raised. As a result of this, immediately after the start-up of the apparatus, it becomes possible to shorten the time needed to raise the temperature of the magnetic metal to the target temperature, and hence shorten the time up to the time at which imaging can be started. Further, thereafter, it becomes possible to set the target temperature at a temperature at which the uniformity of the main magnetic field becomes high, and enable imaging of a higher image quality.

(8) Even when the temperature of the magnetic metal varies to a certain degree, if the range of the variation is within a certain allowable range, the influence of the variation in the uniformity of the main magnetic field incidental to the variation in the temperature of the magnetic metal, on the image quality becomes small. For this reason, the target temperature may include a range to a certain degree.

(9) The present invention can also be applied to a magnetic resonance apparatus in which no imaging is performed.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A magnetic resonance apparatus in which magnetic metal pieces are located in an accommodation section so as to correct uniformity in a main magnetic field, said apparatus comprising:
    an acquisition unit which acquires temperature information related to at least one of (a) a temperature of the magnetic metal pieces in the accommodation section, (b) a temperature of the accommodation section, and (c) a temperature at a position in the vicinity of the accommodation section; and
    a temperature adjustment unit which adjusts the temperature of the magnetic metal pieces to substantially constant a target temperature by heating the magnetic metal pieces on the basis of the temperature information acquired by the acquisition unit.

2. The magnetic resonance apparatus according to claim 1, wherein the temperature adjustment unit includes:
    a cooling unit which cools the magnetic metal pieces, and
    a control unit which controls a cooling power of the cooling unit in such a manner that the temperature of the magnetic metal pieces is adjusted to the target temperature.

3. The magnetic resonance apparatus according to claim 2, wherein the cooling unit cools the magnetic metal pieces by using cooling liquid.

4. The magnetic resonance apparatus according to claim 2, wherein the cooling unit cools the magnetic metal pieces by using cooling gas.

5. The magnetic resonance apparatus according to claim 2, wherein:
    the temperature adjustment unit includes a heating unit which heats the magnetic metal pieces, and
    the control unit controls cooling power of the cooling unit and heating power of the heating unit in such a manner that the temperature of the magnetic metal pieces is adjusted to the target temperature.

6. The magnetic resonance apparatus according to claim 5, wherein the heating unit heats the magnetic metal pieces by using a heater.

7. The magnetic resonance apparatus according to claim 2, further comprising:
    a gradient magnetic field generating unit which generates a gradient magnetic field to be superposed on the main magnetic field, and
    wherein the control unit operates the gradient magnetic field generating unit so as to raise the temperature of the magnetic metal pieces.

8. The magnetic resonance apparatus according to claim 1, wherein the acquisition unit includes:
    a temperature sensor which measures at least one of (a) the temperature of the magnetic metal pieces accommodated in the accommodation section, (b) a temperature of the accommodation section, and (c) a temperature at a position in the vicinity of the accommodation section.

9. The magnetic resonance apparatus according to claim 8, wherein:
    the temperature sensor is arranged at a position at which the temperature varies in accordance with a known correlation coefficient with respect to temperature variation of the magnetic metal pieces, and
    the temperature adjustment unit adjusts the temperature of the magnetic metal pieces estimated on the basis of the temperature measured by the temperature sensor and the correlation coefficient.

10. The magnetic resonance apparatus according to claim 1, wherein:
    the target temperature is a temperature at which uniformity of the main magnetic field is maintained.

11. The magnetic resonance apparatus according to claim 1, further comprising:
    a gradient magnetic field generating unit which generates a gradient magnetic field to be superposed on the main magnetic field, and
    wherein:
    (a) the magnetic resonance apparatus acquires MRI data using at least two types of gradient magnetic field pulse sequences: (i) a first sequence type wherein non-uniformity in the main magnetic field is a less serious problem than in (ii) a second sequence type using plural differing sequences and which therefore requires relatively greater uniformity in the main magnetic field; and
    (b) the temperature adjustment unit adjusts the temperature of the magnetic metal pieces only when the magnetic resonance apparatus performs said second sequence type.

12. The magnetic resonance apparatus according to claim 1, wherein:
the temperature adjustment unit starts adjustment of the temperature of the magnetic metal pieces prior to imaging start time.

13. A magnetic resonance apparatus in which magnetic metal pieces are located in an accommodation section so as to correct uniformity in a main magnetic field, said apparatus comprising:
an acquisition unit which acquires temperature information related to at least one of (a) a temperature of the magnetic metal pieces accommodated in the accommodation section, (b) a temperature of the accommodation section, and (c) a temperature at a position in the vicinity of the accommodation section; and
a temperature adjustment unit which adjusts the temperature of the magnetic metal pieces to a substantially constant target temperature higher than ambient temperature on the basis of the temperature information acquired by the acquisition unit.

14. The magnetic resonance apparatus according to claim 13, wherein:
the temperature adjustment unit adjusts the temperature of the magnetic metal pieces to the target temperature when collection of magnetic resonance signals is performed in the magnetic resonance apparatus.

15. The magnetic resonance apparatus according to claim 13, wherein:
the temperature adjustment unit adjusts the temperature of the magnetic metal pieces to the target temperature before collection of magnetic resonance signals is performed in the magnetic resonance apparatus.

16. A machine-implemented method for reducing variation in static magnetic field non-uniformity of an MRI system caused by temperature variations in metallic magnet shim pieces, said method comprising use of at least one programmed processor and at least one temperature sensor to:
sense a temperature using said at least one temperature sensor which represents the temperature of metallic magnet shim pieces in an MRI system; and
automatically control the temperature of said metallic magnet shim pieces to a substantially constant target temperature based on the sensed temperature.

17. A method according to claim 16, wherein:
said metallic magnet shim pieces are distributed circumferentially between a cylindrical magnetic gradient coil and a coaxially cylindrical magnetic gradient shield coil and thermally coupled with controllable heating and cooling sources; and
said controlling step includes selective control of said heating and cooling sources.

18. A method according to claim 17, wherein:
said controllable heating source includes said magnetic gradient coil; and
said controlling step includes energization of said magnetic gradient coil when heating is required even though not currently being used to acquire MRI data.

19. A method according to claim 16, wherein:
said sensing and controlling step are practiced to preheat said metallic magnet shim pieces to a target temperature higher than ambient before the MRI system is utilized to acquire diagnostic MRI data.

* * * * *